(12) United States Patent
Lu

(10) Patent No.: US 9,018,670 B1
(45) Date of Patent: Apr. 28, 2015

(54) SOLID-STATE LIGHT EMITTING MODULE

(71) Applicant: Lextar Electronics Corporation, Hsinchu (TW)

(72) Inventor: Yu-Hsin Lu, Changhua County (TW)

(73) Assignee: Lextar Electronics Corporation, Hsinchu (TW)

( * ) Notice: Subject to any disclaimer, the term of this patent is extended or adjusted under 35 U.S.C. 154(b) by 0 days.

(21) Appl. No.: 14/305,006

(22) Filed: Jun. 16, 2014

(30) Foreign Application Priority Data

Dec. 16, 2013 (TW) .............................. 102146420 A

(51) Int. Cl.
| | |
|---|---|
| *H01L 33/00* | (2010.01) |
| *H01L 33/50* | (2010.01) |
| *H01L 33/54* | (2010.01) |
| *H01L 33/52* | (2010.01) |
| *H01L 33/20* | (2010.01) |

(52) U.S. Cl.
CPC .............. *H01L 33/504* (2013.01); *H01L 33/54* (2013.01); *H01L 33/52* (2013.01); *H01L 33/20* (2013.01); *H01L 33/50* (2013.01)

(58) Field of Classification Search
CPC .......... H01L 33/20; H01L 33/50; H01L 33/52
USPC .................................................. 257/99, 100
See application file for complete search history.

(56) References Cited

U.S. PATENT DOCUMENTS

| 6,423,585 | B1* | 7/2002 | Yamazaki et al. | ............. 438/166 |
| 2005/0218468 | A1* | 10/2005 | Owen et al. | .................... 257/433 |
| 2013/0153935 | A1* | 6/2013 | Hodrinsky et al. | ............. 257/88 |
| 2014/0049965 | A1* | 2/2014 | Aanegola et al. | ............. 362/259 |
| 2014/0225151 | A1* | 8/2014 | Jung et al. | ........................ 257/99 |
| 2014/0363908 | A1* | 12/2014 | Lowenthal et al. | ............. 438/27 |

FOREIGN PATENT DOCUMENTS

| TW | 506145 | 10/2002 |
| TW | 200843146 | 11/2008 |
| TW | 200945937 | 11/2009 |

* cited by examiner

*Primary Examiner* — Ngan Ngo
(74) *Attorney, Agent, or Firm* — CKC & Partners Co., Ltd.

(57) ABSTRACT

A solid-state light-emitting module includes a transparent substrate, a light emitting diode chip, a first package sealant, a second package sealant, and a wavelength selection structure layer. The transparent substrate includes a first surface, a second surface which is opposite to the first surface, and a side face surrounding and connecting the first surface and the second surface. The light emitting diode chip is fixed on the first surface to emit light with a first wavelength. The first package sealant is disposed on the first surface to cover the light emitting diode chip. The second package sealant is disposed on the second surface and opposite to the first package sealant. The wavelength selection structure layer is disposed on the side face of the transparent substrate for selectively reflecting or transmitting the light therethrough.

13 Claims, 4 Drawing Sheets

SOLID-STATE LIGHT EMITTING MODULE

RELATED APPLICATIONS

This application claims priority to Taiwan Application Serial Number 102146420, filed Dec. 16, 2013, which is herein incorporated by reference.

BACKGROUND

1. Field of Invention

The present invention relates to a light emitting device. More particularly, the present invention relates to a solid-state light emitting module that utilizes a transparent substrate.

2. Description of Related Art

The light emitting diode is a kind of semiconductor electronic component that emits light, and is a complex light source formed by a trivalent element and a pentavalent element. The light emitting diode has advantages over conventional light sources, including high efficiency, long life span, ruggedness, high response speed, high reliability, etc.

If a light emitting diode is disposed on a transparent substrate, it has a high light extraction efficiency. However, the transparent substrate will function as a waveguide with respect to the light emitted from a light emitting diode chip, and the light will leak through the side surfaces of the transparent substrate. As a result, the color of the light emitted by the light emitting diode is not uniform.

Therefore, there is a need to determine ways in which to maintain a high light extraction efficiency with respect to a light emitting module that utilizes a transparent substrate, and further realize the emission of a uniform color of light by such a light emitting module.

SUMMARY

A solid-state light emitting module is provided to resolve the problems encountered in the prior art.

According to an embodiment of the present invention, the solid-state light emitting module includes a transparent substrate, a light emitting diode chip, a first package sealant, a second package sealant, and a wavelength selection structure layer. The transparent substrate includes a first surface, a second surface opposite to the first surface and a side face which surrounds and connects the first surface and the second surface. The light emitting diode chip is fixed on the first surface to emit light with a first wavelength. The first package sealant is disposed on the first surface to cover the light emitting diode chip. The second package sealant is disposed on the second surface and opposite to the first package sealant. The wavelength selection structure layer is disposed on the side face of the transparent substrate for selectively reflecting or transmitting the light therethrough.

In an embodiment, the solid-state light emitting module further includes at least one wavelength conversion material which is disposed inside the first package sealant and the second package sealant. The wavelength conversion material is excited by a portion of the light with the first wavelength to emit light with a second wavelength, wherein the light with the second wavelength is mixed with a remaining portion of the light with the first wavelength to emit light with a third wavelength.

In an embodiment, a portion of the light with the first wavelength that arrives at the side face is reflected by the wavelength selection structure layer back into the transparent substrate, and a remaining portion of the light with the first wavelength that arrives at the side face passes through the wavelength selection structure layer. A portion of the light with the second wavelength that arrives at the side face passes through the wavelength selection structure layer, and a remaining portion of the light with the second wavelength that arrives at the side face is reflected by the wavelength selection structure layer back into the transparent substrate.

In an embodiment, the wavelength selection structure layer comprises a three-dimension (3D) photonic crystal structure.

In an embodiment, the 3D photonic crystal structure is a hexagonal dose-packed structure that comprises a plurality of spheres, and the plurality of spheres has the same diameter.

In an embodiment, a material of the plurality of spheres comprises polystyrene (PS).

In an embodiment, a range of the diameter is 180-200 nm.

In an embodiment, a material of the transparent substrate is selected from the group consisting of glass, sapphire, gallium phosphide (GaP), silicon carbide (SiC), Aluminum Gallium Arsenide (AlGaAs), aluminum oxide (Al2O3), and a combination thereof.

In an embodiment, the light emitting diode chip is a blue light emitting diode chip or a UV light emitting diode chip.

In an embodiment, a material of the first package sealant and the second package sealant is selected from the group consisting of silicone gel, epoxy resin, silicone, and a combination thereof.

In an embodiment, a material of the wavelength conversion material is selected from the group consisting of fluorescent pigment, organic phosphor, inorganic phosphor, and a combination thereof.

In an embodiment, a surface of each of the first package sealant and the second package sealant is a semicircle curved surface.

In an embodiment, the wavelength selection structure layer is disposed on the side face of the transparent substrate and further extended to a part of the first surface of the transparent substrate that is not covered by the first package sealant and extended to a part of the second surface of the transparent surface that is not covered by the second package sealant.

In summary, the present invention has significant advantages and higher performance over current technology. With the present invention, significant technological improvements are realized, and the present invention may be widely used and implemented in industry. The advantages of the present invention relate to the disposition of the wavelength selection structure layer, such that the solid-state light emitting module generates light with a uniform color.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
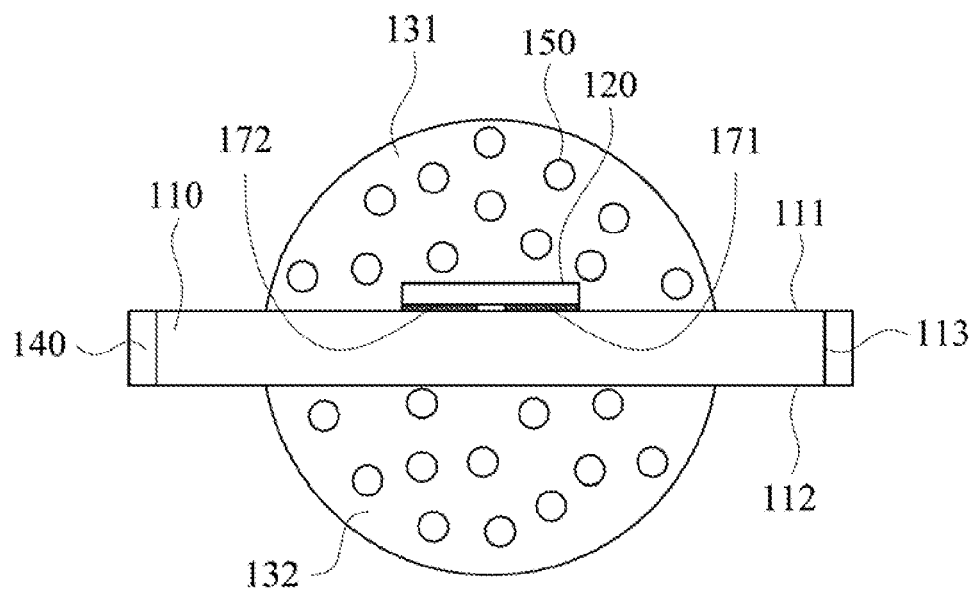
FIG. 1 is a cross-sectional diagram of a solid-state light emitting module according to an embodiment of the present invention.

Reference will now be made in detail to the present embodiments of the invention, examples of which are illustrated in the accompanying drawings. Wherever possible, the same reference numbers are used in the drawings and the description to refer to the same or like parts. In addition, well-known components and steps are not described in the embodiments to avoid unnecessary limitations to the present invention.

FIG. 1 is a cross-sectional diagram of a solid-state light emitting module according to an embodiment of the present invention. As shown in FIG. 1, in an embodiment, the solid-state light emitting module includes a transparent substrate 110, a light emitting diode chip 120, a first package sealant 131, a second package sealant 132, and a wavelength selection structure layer 140. The transparent substrate 110 includes a first surface 111, a second surface 112, and a side face 113. The second surface 112 is opposite to the first surface 111, and the side face 113 surrounds and connects the first surface 111 and the second surface 112. The light emitting diode chip 120 is fixed on the first surface 111 of the transparent substrate 110. In greater detail, the light emitting diode chip 120 is joined to the first surface 111 of the transparent substrate 110 through the flip-chip method, and is electrically connected to conductive layers 171, 172 which are disposed on the first surface 111 of the transparent substrate 110. The wavelength selection structure layer 140 is disposed on the side face 113 of the transparent substrate 110.

The first package sealant 131 is disposed on the first surface 111 of the transparent substrate 110, and the light emitting diode chip 120 is covered with the first package sealant 131. The second package sealant 132 is disposed on the second surface 112 of the transparent substrate 110, and the second package sealant 132 corresponds in position to the first package sealant 131, i.e., the first package sealant 131 and the second package sealant 132 are disposed on opposite sides of the transparent substrate 110 corresponding in position vertically. In an embodiment, an outer surface of each the first package sealant 131 and the second package sealant 132 is a semicircle curved surface. Because the outer surface of each of the first package sealant 131 and the second package sealant 132 is a semicircle curved surface, the light emitted from the solid-state light emitting module is uniform.

In an embodiment, the solid-state light emitting module further includes a wavelength conversion material 150 which is disposed inside the first package sealant 131 and the second package sealant 132. A system power source provides power to the light emitting diode chip 120 through the conductive layers 171, 172 to make the light emitting diode chip 120 emit light with a first wavelength. The wavelength conversion material 150 is excited by a portion of the light with the first wavelength emitted from the light emitting diode chip 120 to emit light with a second wavelength. The light with the second wavelength is mixed with the light with the first wavelength to generate light with a third wavelength.

The wavelength selection structure layer 140 is configured to selectively reflect or transmit the light inside the transparent substrate 110. In an embodiment, most of the light with the first wavelength that arrives at the side face 113 is reflected by the wavelength selection structure layer 140 back into the transparent substrate 110, and a remaining portion of the light with the first wavelength that arrives at the side face 113 passes through the wavelength selection structure layer 140. The light with the first wavelength reflected back into the transparent substrate 110 may enter the first package sealant 131 or the second package sealant 132. The wavelength conversion material 150 is excited by the light with the first wavelength to emit the light with the second wavelength, or the light with the first wavelength is mixed with the light with the second wavelength to emit the light with the third wavelength. In contrast, most of the light with the second wavelength that arrives at the side face 113 passes through the wavelength selection structure layer 140, and a remaining portion of the light with the second wavelength that arrives at the side face 113 is reflected by the wavelength selection structure layer 140 back into the transparent substrate 110. The light with the second wavelength that is reflected back into the transparent substrate 110 may be mixed with the light with the first wavelength to emit light with the third wavelength.

In an embodiment, a material, of the transparent substrate 110 is selected from the group consisting of glass, sapphire, gallium phosphide (GaP), silicon carbide (SiC), Aluminum Gallium Arsenide (AlGaAs), aluminum oxide ($Al_2O_3$), and a combination thereof. In an embodiment, the light emitting diode chip 120 is a blue light emitting diode chip or a UV light emitting diode chip. A range of the light wavelength of the blue light emitting diode chip is about 450-470 nm, and a range of the light wavelength of the UV light emitting diode chip is about 370-400 nm. In an embodiment, a material of each of the first package sealant 131 and the second package sealant 132 is selected from the group consisting of silicone gel, epoxy resin, silicone, and a combination thereof, and may be specifically selected according to the type of the light emitting diode chip 120 (e.g., normal brightness, high brightness, high power, high hardness).

In an embodiment, the wavelength selection structure layer 140 comprises a three-dimension (3D) photonic crystal structure. The photonic crystal structure is an orderly optical structure made by a periodicity arrangement medium with a different refractive index. Because the photonic crystal structure may generate an energy band structure which has a wavelength selection function, it can pass light within one wave band but stop light within other wave bands. In an embodiment, the wavelength conversion material 150 is selected from the group consisting of fluorescent pigment, organic phosphor, inorganic phosphor, and a combination thereof.

For example, when the light emitting diode chip 120 is a blue light emitting diode chip, the system power source provides power to the blue light emitting diode chip through the conductive layers 171, 172 to cause the blue light emitting diode chip emit light with the first wavelength, i.e., blue light. A portion of the blue light emitted from the blue light emitting diode chip excites the wavelength conversion material 150 to emit yellow light, and a remaining portion of the blue light emitted from the blue light emitting diode chip is mixed with the yellow light to emit white light. Most of the blue light that arrives at the side face 113 is reflected by the wavelength selection structure layer 140 back into the transparent substrate 110, and a remaining portion of the blue light passes through the wavelength selection structure layer 140. The blue light reflected back into the transparent substrate 110 may enter the first package sealant 131 or the second package sealant 132, and the wavelength conversion material 150 is excited by the blue light to emit the yellow light or the blue light is mixed with the yellow light to emit the white light. In contrast, most of the yellow light that arrives at the side face 113 is transmitted through the wavelength selection structure layer 140, and a remaining portion of the yellow light is reflected back into the transparent substrate 110. The yellow light reflected back into the transparent substrate 110 may be mixed with the blue light to emit the white light. Both the blue light and the yellow light emitted out of the wavelength selection structure layer 140 are mixed to emit the white light, such that the light that is emitted from the solid-state light emitting module is the white light.

Figure 2:
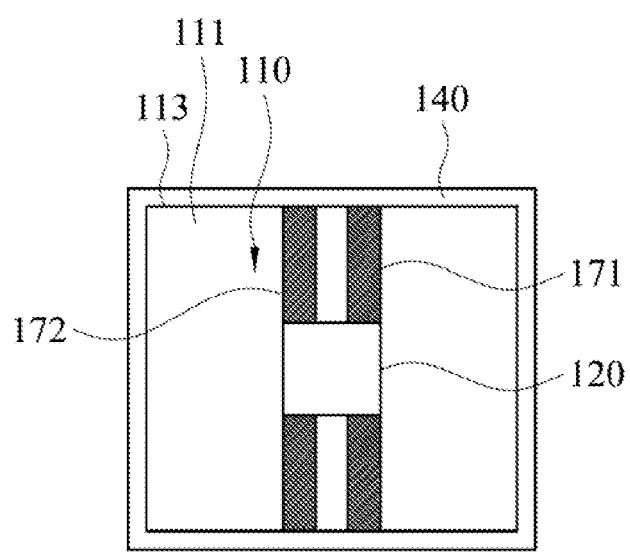
FIG. 2 is a top plan view of the solid-state light emitting module of FIG. 1 shown in a state without a first package sealant according to an embodiment of the present invention.

FIG. 2 is a top plan view of the solid-state light emitting module of FIG. 1 shown in a state without the first package sealant 131 according to an embodiment of the present invention. As shown in FIGS. 1 and 2, the transparent substrate 110 is quadrilateral in shape, and has a thickness. The light emitting diode chip 120 is fixed on the first surface 111 of the transparent substrate 110, and the wavelength selection structure layer 140 is disposed on the side face 113 of the transparent substrate 110 and surrounds the side face 113. The conductive layers 171, 172 may be formed on the first surface 111 of the transparent substrate 110. The light emitting diode chip 120 is joined to the first surface 111 of the transparent substrate 110 through the flip-chip method, and is electrically connected to the conductive layers 171, 172.

Figure 3:
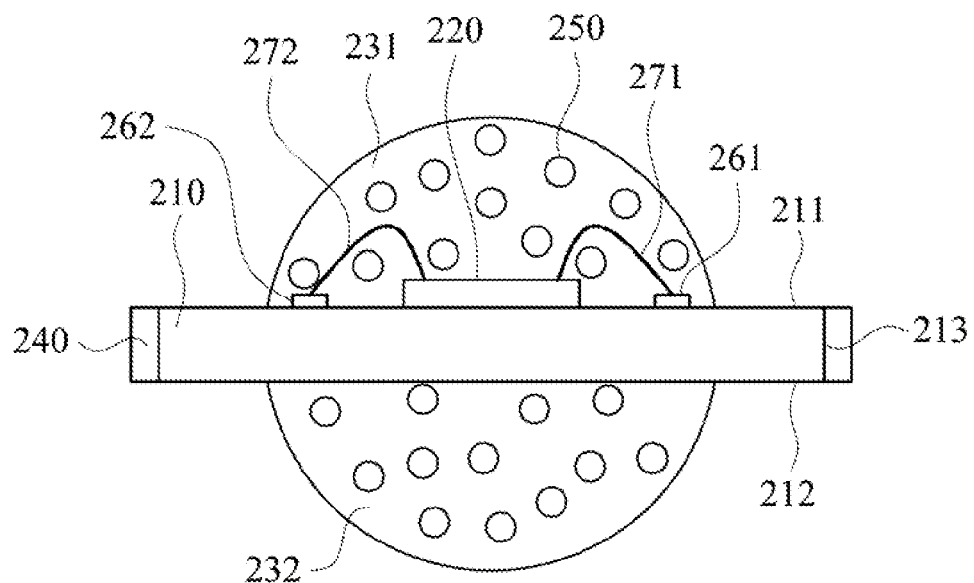
FIG. 3 is a cross-sectional diagram of a solid-state light emitting module according to another embodiment of the present invention.

FIG. 3 is a cross-sectional diagram of a solid-state light emitting module according to another embodiment of the present invention. As shown in FIG. 3, in an embodiment, the solid-state light emitting module includes a transparent substrate 210, a light emitting diode chip 220, a first package sealant 231, a second package sealant 232, a wavelength selection structure layer 240, and a wavelength conversion material 250. The transparent substrate 210 includes a first surface 211, a second surface 212, and a side face 213. The second surface 212 is opposite to the first surface 211, and the side face 213 surrounds and connects the first surface 211 and the second surface 212. The light emitting diode chip 220 is fixed on the first surface 211 of the transparent substrate 210 by a silver paste or an insulation paste. Conductive layers 261, 262 are disposed on the first surface 211 of the transparent substrate 210, and the light emitting diode chip 220 and the conductive layers 261, 262 are electrically connected respectively through wires 271, 272. A system power source provides power to the light emitting diode chip 220 through the conductive layers 261, 262 and the wires 271, 272 to emit the light with the first wavelength. With respect to the disposed positions and the functions of the first package sealant 231, the second package sealant 232, the wavelength selection structure layer 240, and the wavelength conversion material 250, these are the same as for the corresponding elements shown in FIG. 1. Hence, a description in this regard will not be repeated.

Figure 4:
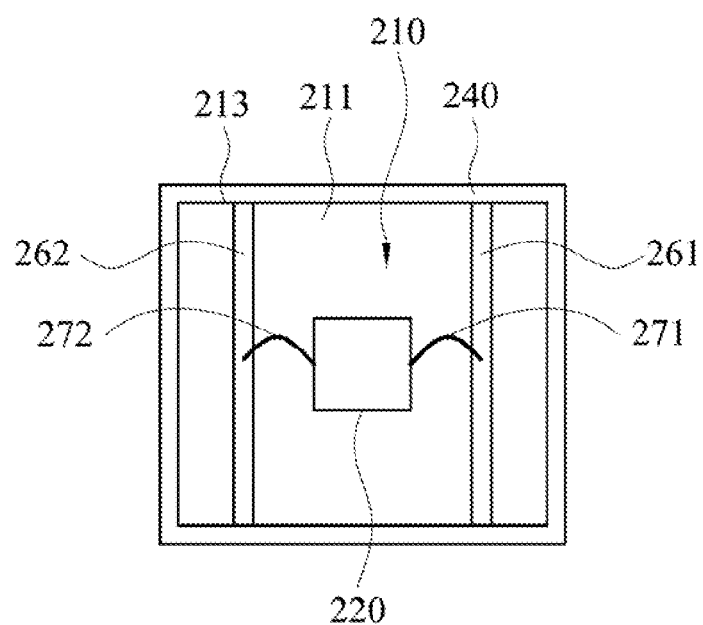
FIG. 4 is a top plan view of the solid-state light emitting module of FIG. 3 shown in a state without a second package sealant according to an embodiment of the present invention.

FIG. 4 is a top plan view of the solid-state light emitting module of FIG. 3 shown in a state without the second package sealant 232 according to an embodiment of the present invention. As shown in FIGS. 3 and 4, the transparent substrate 210 is a quadrilateral in shape, and has a thickness. The light emitting diode chip 220 is fixed on the first surface 211 of the transparent substrate 210, and the wavelength selection structure layer 240 is disposed on the side face 213 of the transparent substrate 210 and surrounds the side face 213. The conductive layers 261, 262 are disposed on the first surface 211 of the transparent substrate 210, and the wires 271, 272 are electrically connected the light emitting diode chip 220 and respectively to the conductive layers 261, 262. The light emitting diode chip 220 receives power through the conductive layers 261, 262 and the wires 271, 272.

Figure 5:
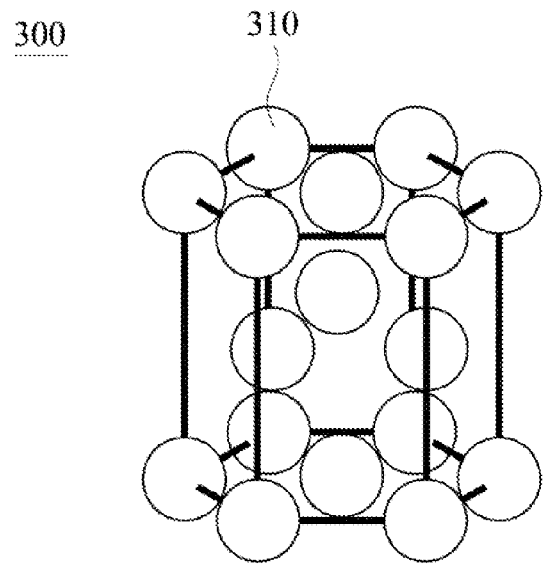
FIG. 5 is a 3D structure schematic diagram of a crystal structure of a wavelength selection structure layer according to an embodiment of the present invention.

FIG. 5 is a 3D structure schematic diagram of a wavelength selection structure layer according to an embodiment of the present invention. As shown in FIG. 5, in an embodiment, a three-dimension (3D) photonic crystal structure is a hexagonal close-packed structure 300 that is composed of a plurality of spheres, in which the sphere 310 is one of the spheres with the same diameter. The hexagonal close-packed structure 300 is one type of arrangement for a crystal, and it is also a lattice form of a crystal structure. In the hexagonal close-packed structure 300, many spheres with the same diameter are combined to achieve the largest spatial utilization rate.

Figures 6A, 6B, 6C:
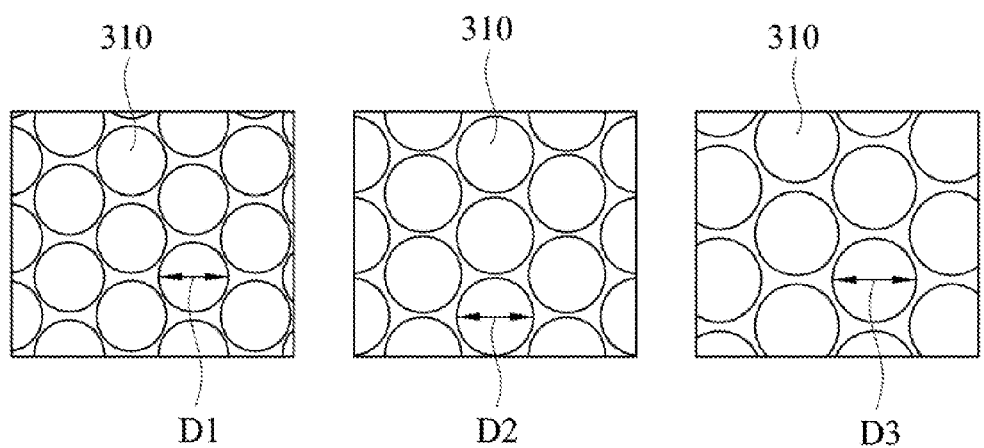
FIG. 6A is a schematic diagram of an arrangement of spheres of FIG. 5 according to an embodiment of the present invention.
FIG. 6B is a schematic diagram of an arrangement of the spheres of FIG. 5 according to another embodiment of the present invention.
FIG. 6C is a schematic diagram of an arrangement of the spheres of FIG. 5 according to yet another embodiment of the present invention.

FIG. 6A is a schematic diagram of an arrangement of the spheres of FIG. 5 according to an embodiment of the present invention, FIG. 6B is a schematic diagram of an arrangement of the spheres of FIG. 5 according to another embodiment of the present invention, and FIG. 6C is a schematic diagram of an arrangement of the spheres of FIG. 5 according to yet another embodiment of the present invention. As shown in FIGS. 6A, 6B, and 6C, when looking downwardly at each sphere arrangement of the hexagonal close-packed structure 300 under the isometric size, the spheres 310 may have different diameters D1, D2, or D3. For example, the diameter D1 is 200 nm, the diameter D2 is 220 nm, and the diameter D3 is 230 nm. Each structure consisting of the spheres 310 with the different diameters D1, D2, and D3 achieve a different spatial utilization rate.

Figure 7:
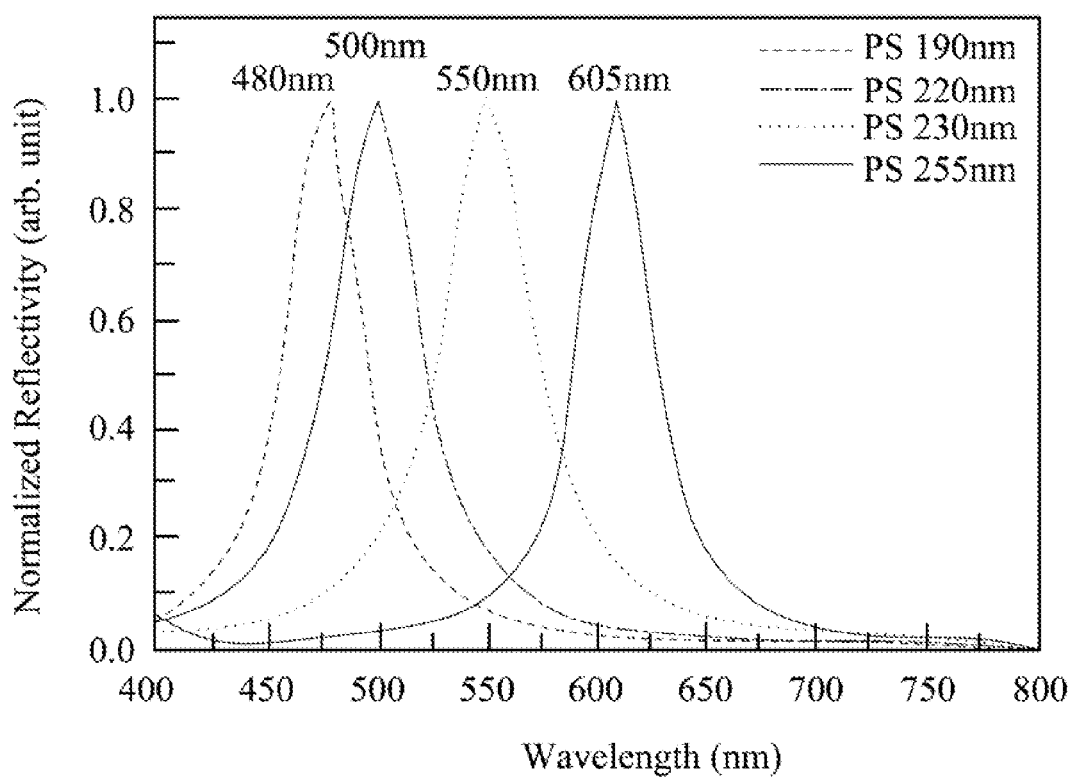
FIG. 7 is a graph illustrating a relation between a light wavelength and a diameter of a sphere of a solid-state light emitting module according to an embodiment of the present invention.

FIG. 7 is a graph illustrating a relation between a light wavelength and a diameter of a sphere of a solid-state light emitting module according to an embodiment of the present invention. In an embodiment, the diameter of the spheres is between 180 nm and 200 nm. When the diameter of the spheres is 190 nm, the wavelength selection structure layer 140 (see FIG. 1) may fully reflect light with a wavelength of 480 nm. Therefore, the diameter of the spheres in the wavelength selection structure layer 140 may be used to select the light wavelength that passes through the wavelength selection structure layer 140 to thereby determine the color of the light emitted from the solid-state light emitting module. In an embodiment, the material of the spheres is polystyrene (PS).

Reference is made to FIG. 1 again, when the wavelength selection structure layer 140 is disposed on the side face 113 of the transparent substrate 110, the light emitted from the light emitting diode chip 120 may leak through part of the first surface 111 of the transparent substrate 110 that is not covered by the first package sealant 131 and/or part of the second surface 112 of the transparent substrate 110 that is not covered by the second package sealant 132.

Figure 8:
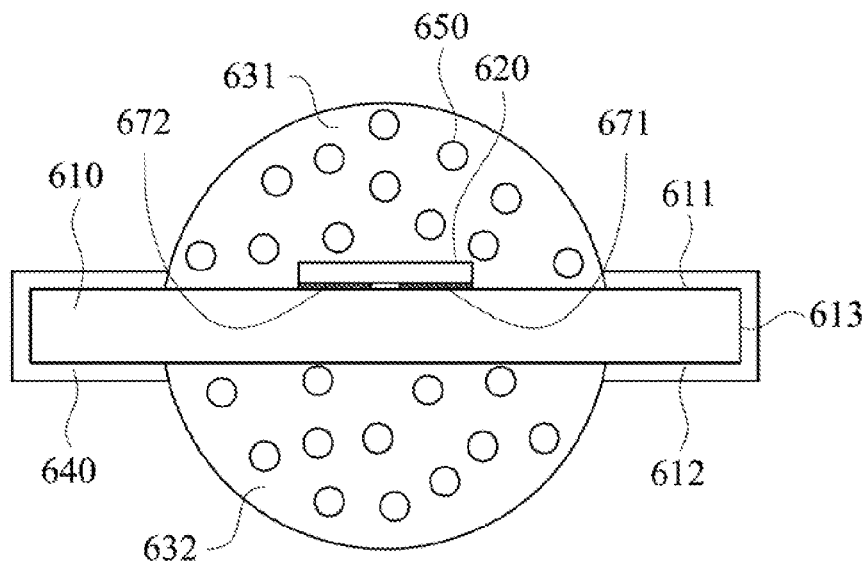
FIG. 8 is a cross-sectional diagram of a solid-state light emitting module according to yet another embodiment of the present invention.

FIG. 8 is a cross-sectional diagram of a solid-state light emitting module according to another embodiment of the present invention. As shown in FIG. 8, to enhance light color uniformity, a wavelength selection structure layer 640 is disposed on a side 613 of a transparent substrate 610, and is further extended to a part of a first surface 611 of the transparent substrate 610 that is not covered by a first package sealant 631 and to a part of a second surface 612 of the transparent substrate 610 that is not covered by a second package sealant 632. Hence, in this embodiment, the transparent substrate 610 is covered with the first package sealant 631, the second package sealant 632, and the wavelength selection structure layer 640. In an embodiment, a light emitting diode chip 620 is joined to the first surface 611 of the transparent substrate 610 through the flip-chip method, and is electrically connected to conductive layers 671, 672. Alternatively, in other embodiments, the light emitting diode chip 620 is electrically connected to a conductive layer (not shown) disposed on the first surface 611 of the transparent substrate 610 by wire bonding (not shown). Those skilled in the art may specifically and flexibly implement these modules depending on the particular requirements.

To provide an example of the operation of this embodiment, when the light emitting diode chip 620 is a blue light emitting diode chip, the wavelength conversion material 650 is excited by a part of the blue light emitted from the light emitting diode chip 620 to emit the yellow light, and the yellow light is mixed with a remaining portion of the blue light to emit the white light. The light that is emitted through the first package sealant 631 and the second package sealant 632 is the white light, and the light that passes through the wavelength selection structure layer 640 is also the white light. Hence, the light that is emitted from the solid-state light emitting module is the same, i.e., white light.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A solid-state light emitting module, comprising:
   a transparent substrate comprising a first surface, a second surface opposite to the first surface, and a side face surrounding and connecting the first surface and the second surface;
   at least a light emitting diode chip fixed on the first surface to emit light with a first wavelength;
   a first package sealant disposed on the first surface to cover the light emitting diode chip;
   a second package sealant disposed on the second surface and opposite to the first package sealant; and
   a wavelength selection structure layer disposed on the side face of the transparent substrate for selectively reflecting or transmitting the light therethrough.

2. The solid-state light emitting module of claim 1, further comprising:
   at least one wavelength conversion material disposed inside the first package sealant and the second package sealant, the wavelength conversion material being excited by a portion of the light with the first wavelength to emit light with a second wavelength, wherein the light with the second wavelength is mixed with a remaining portion of the light with the first wavelength to emit light with a third wavelength.

3. The solid-state light emitting module of claim 2, wherein a portion of the light with the first wavelength that arrives at the side face is reflected by the wavelength selection structure layer back into the transparent substrate, a remaining portion of the light with the first wavelength that arrives at the side face passes through the wavelength selection structure layer, a portion of the light with the second wavelength that arrives at the side face passes through the wavelength selection structure layer, and a remaining portion of the light with the second wavelength that arrives at the side face is reflected by the wavelength selection structure layer back into the transparent substrate.

4. The solid-state light emitting module of claim 1, wherein the wavelength selection structure layer comprises a three-dimension (3D) photonic crystal structure.

5. The solid-state light emitting module of claim 4, wherein the 3D photonic crystal structure is a hexagonal close-packed structure which comprises a plurality of spheres, and the plurality of spheres has the same diameter.

6. The solid-state light emitting module of claim 5, wherein a material of the plurality of spheres comprises polystyrene (PS).

7. The solid-state light emitting module of claim 5, wherein a range of the diameter is 180-200 nm.

8. The solid-state light emitting module of claim 1, wherein a material of the transparent substrate is selected from the group consisting of glass, sapphire, gallium phosphide (GaP), silicon carbide (SiC), Aluminum Gallium Arsenide (AlGaAs), aluminum oxide (Al2O3), and a combination thereof.

9. The solid-state light emitting module of claim 1, wherein the light emitting diode chip is a blue light emitting diode chip or a UV light emitting diode chip.

10. The solid-state light emitting module of claim 1, wherein a material of the first package sealant and the second package sealant is selected from the group consisting of silicone gel, epoxy resin, silicone, and a combination thereof.

11. The solid-state light emitting module of claim 1, wherein a material of the wavelength conversion material is selected from the group consisting of fluorescent pigment, organic phosphor, inorganic phosphor, and a combination thereof.

12. The solid-state light emitting module of claim 1, wherein a surface of each of the first package sealant and the second package sealant is a semicircle curved surface.

13. The solid-state light emitting module of claim 1, wherein the wavelength selection structure layer is disposed on the side face of the transparent substrate and further extended to a part of the first surface of the transparent substrate that is not covered by the first package sealant and extended to a part of the second surface of the transparent surface that is not covered by the second package sealant.

* * * * *